United States Patent
Chen

(10) Patent No.: US 10,777,716 B1
(45) Date of Patent: Sep. 15, 2020

(54) PIXEL ENCAPSULATING STRUCTURE

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 16/358,716

(22) Filed: Mar. 20, 2019

(51) Int. Cl.
| | |
|---|---|
| H01L 33/00 | (2010.01) |
| H01L 21/00 | (2006.01) |
| H01L 33/60 | (2010.01) |
| H01L 27/32 | (2006.01) |
| H01L 21/66 | (2006.01) |
| H04B 10/00 | (2013.01) |

(52) U.S. Cl.
CPC .............. *H01L 33/60* (2013.01); *H01L 22/12* (2013.01); *H01L 27/3211* (2013.01); *H04B 10/00* (2013.01)

(58) Field of Classification Search
CPC ....... H01L 33/60; H01L 27/3211; H01L 22/12
USPC ............................. 438/25–29, 35; 257/88, 98
See application file for complete search history.

(56) References Cited

U.S. PATENT DOCUMENTS

| | | | |
|---|---|---|---|
| 7,868,528 B2 * | 1/2011 | Kobayashi | H01L 51/5281 313/112 |
| 10,461,278 B2 * | 10/2019 | Fukuda | H01L 51/5265 257/89 |
| 2019/0035364 A1 * | 1/2019 | Iwasaki | G09G 3/003 |

FOREIGN PATENT DOCUMENTS

JP    2005-100946    * 7/2004    ......... H01L 51/5265

* cited by examiner

*Primary Examiner* — Calvin Lee
(74) *Attorney, Agent, or Firm* — CKC & Partners Co., LLC

(57) ABSTRACT

A pixel encapsulating structure including a substrate, a first light-emitting device, a second light-emitting device, and a filling material is provided. The first light-emitting device is on the substrate. The second light-emitting device is on the substrate. The first light-emitting device and the second light-emitting device have different emission wavelengths. The filling material is on the substrate, the first light-emitting device, and the second light-emitting device. The filling material has two portions respectively covering the first light-emitting device and the second light-emitting device, and said two portions have different refractive indices.

10 Claims, 7 Drawing Sheets

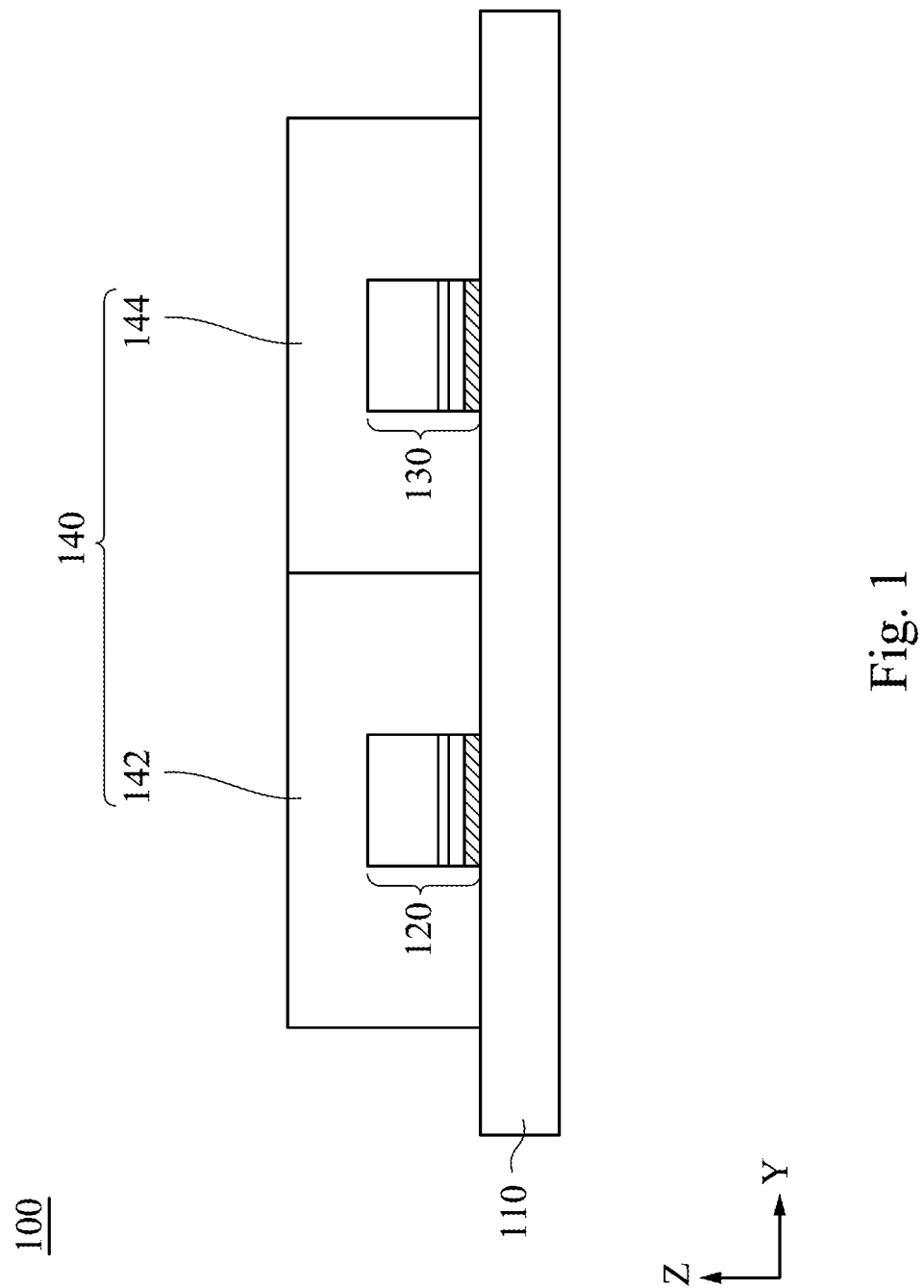

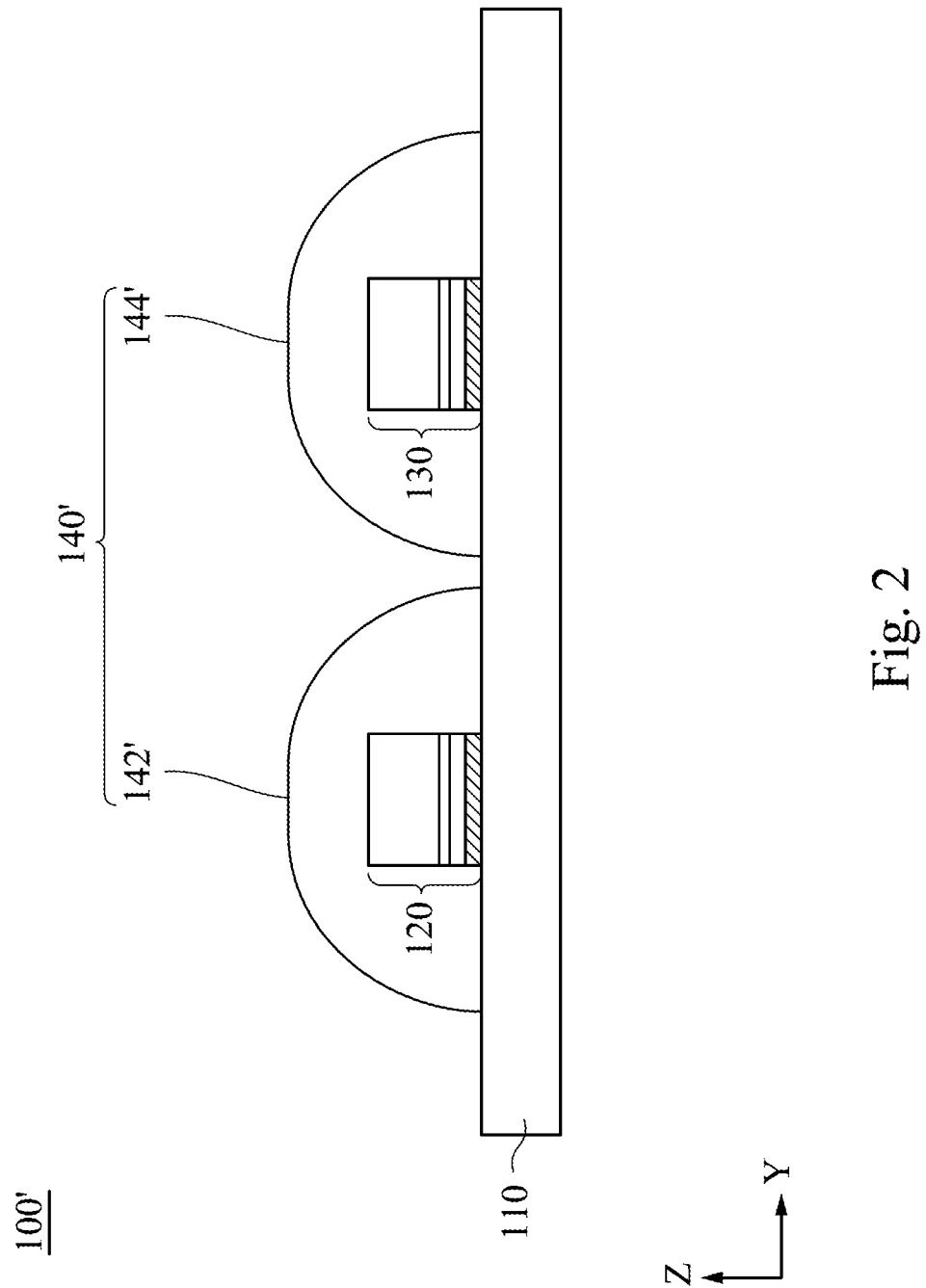

PIXEL ENCAPSULATING STRUCTURE

BACKGROUND

Field of Invention

The present disclosure relates to a pixel encapsulating structure for encapsulating a light-emitting device therein.

Description of Related Art

The statements in this section merely provide background information related to the present disclosure and do not necessarily constitute prior art.

In recent years, micro devices have become popular in various applications. One of the important subfields is micro light-emitting devices. Among all technical aspects of micro light-emitting devices, color shift viewed by a user in different angles with respect to a normal direction of a display is an important and long-standing issue.

SUMMARY

According to some embodiments of the present disclosure, a pixel encapsulating structure including a substrate, a first light-emitting device, a second light-emitting device, and a filling material is provided. The first light-emitting device is on the substrate. The second light-emitting device is on the substrate. The first light-emitting device and the second light-emitting device have different emission wavelengths. The filling material is on the substrate, the first light-emitting device, and the second light-emitting device. The filling material has two portions respectively covering the first light-emitting device and the second light-emitting device, and said two portions have different refractive indices.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 1 is a cross-sectional view of a pixel encapsulating structure according to some embodiments of the present disclosure;

FIG. 2 is a cross-sectional view of a pixel encapsulating structure according to some embodiments of the present disclosure;

DETAILED DESCRIPTION

Figure 3A:
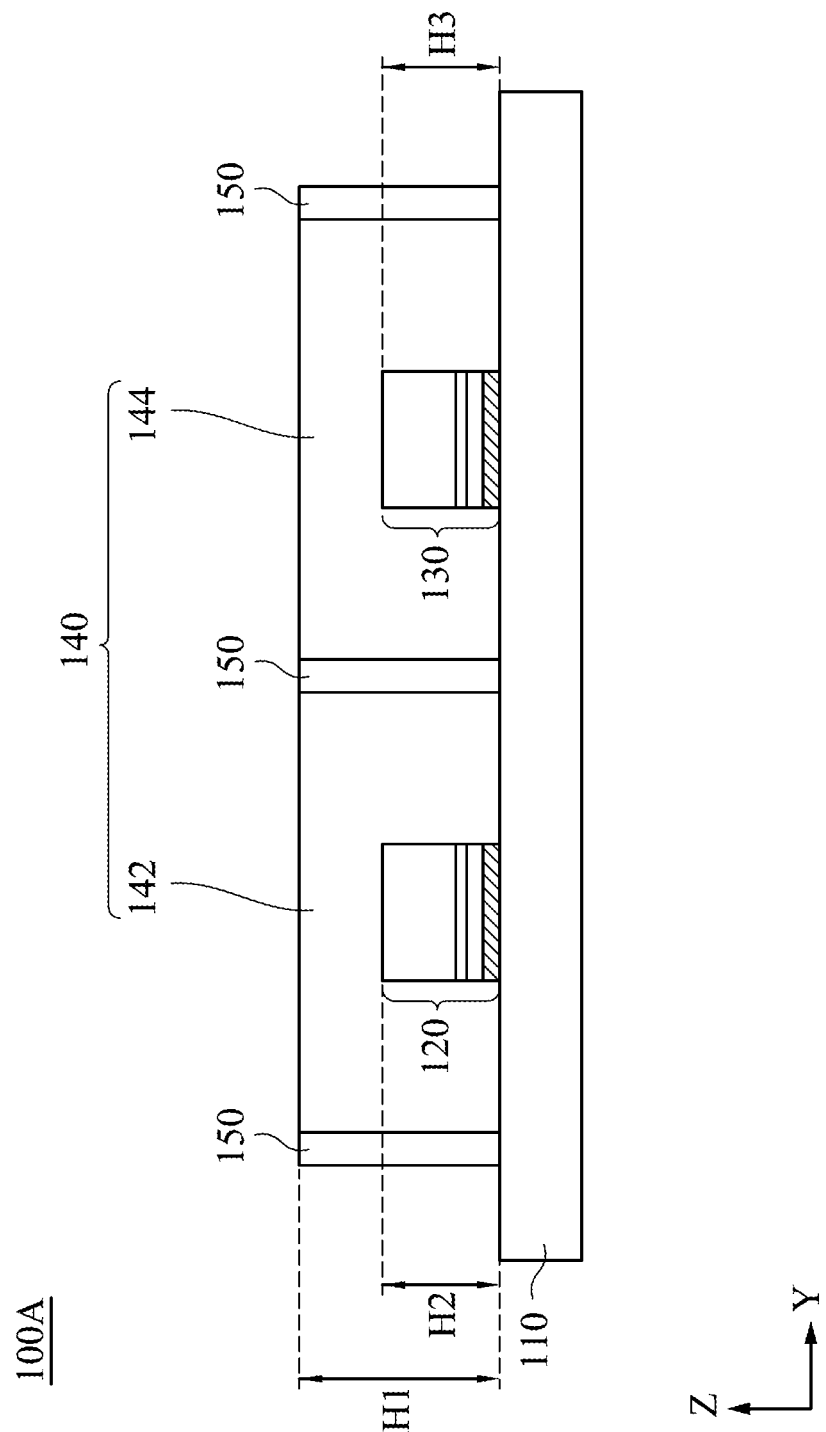
FIG. 3A is a cross-sectional view of a pixel encapsulating structure according to some embodiments of the present disclosure.
Figure 3B:
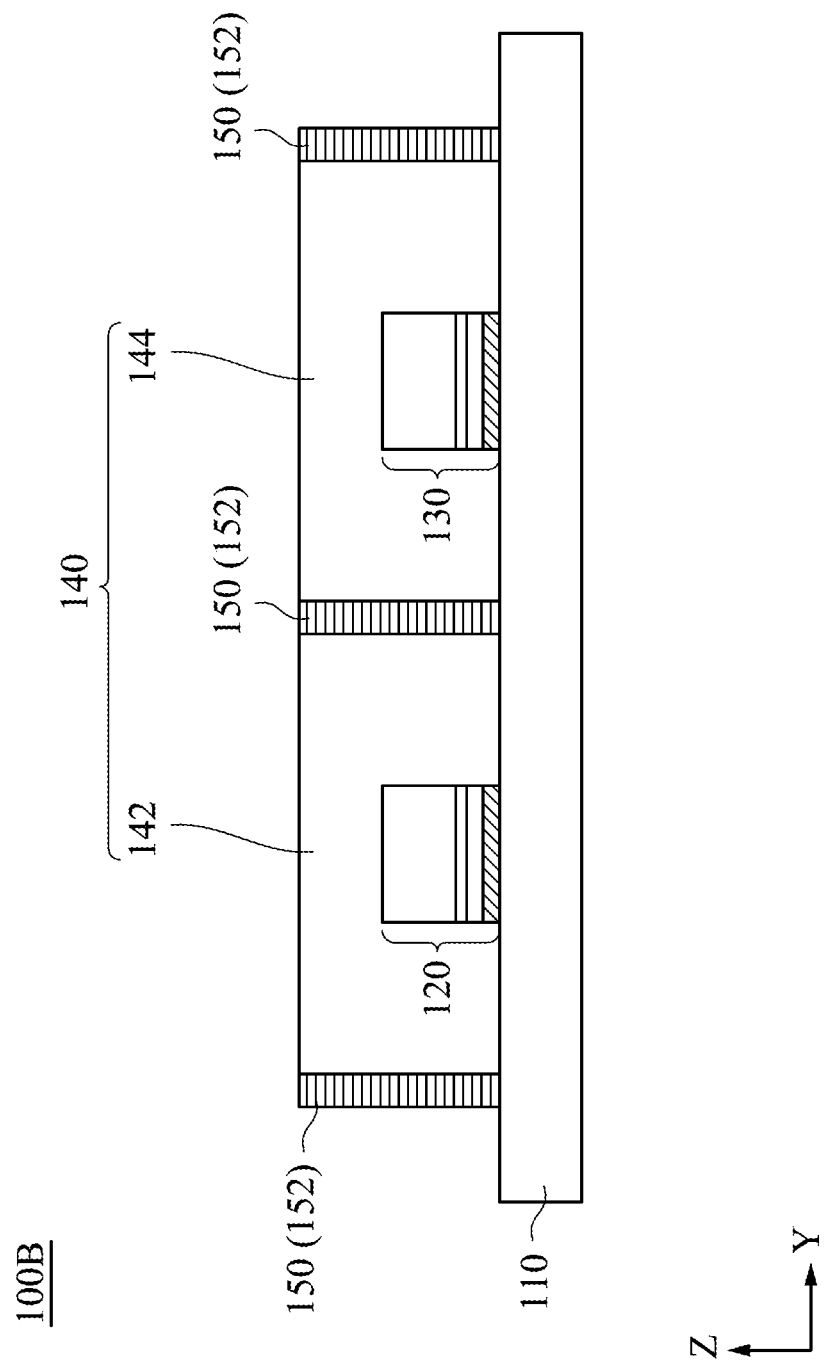
FIG. 3B is a cross-sectional view of a pixel encapsulating structure according to some embodiments of the present disclosure.
Figure 3C:
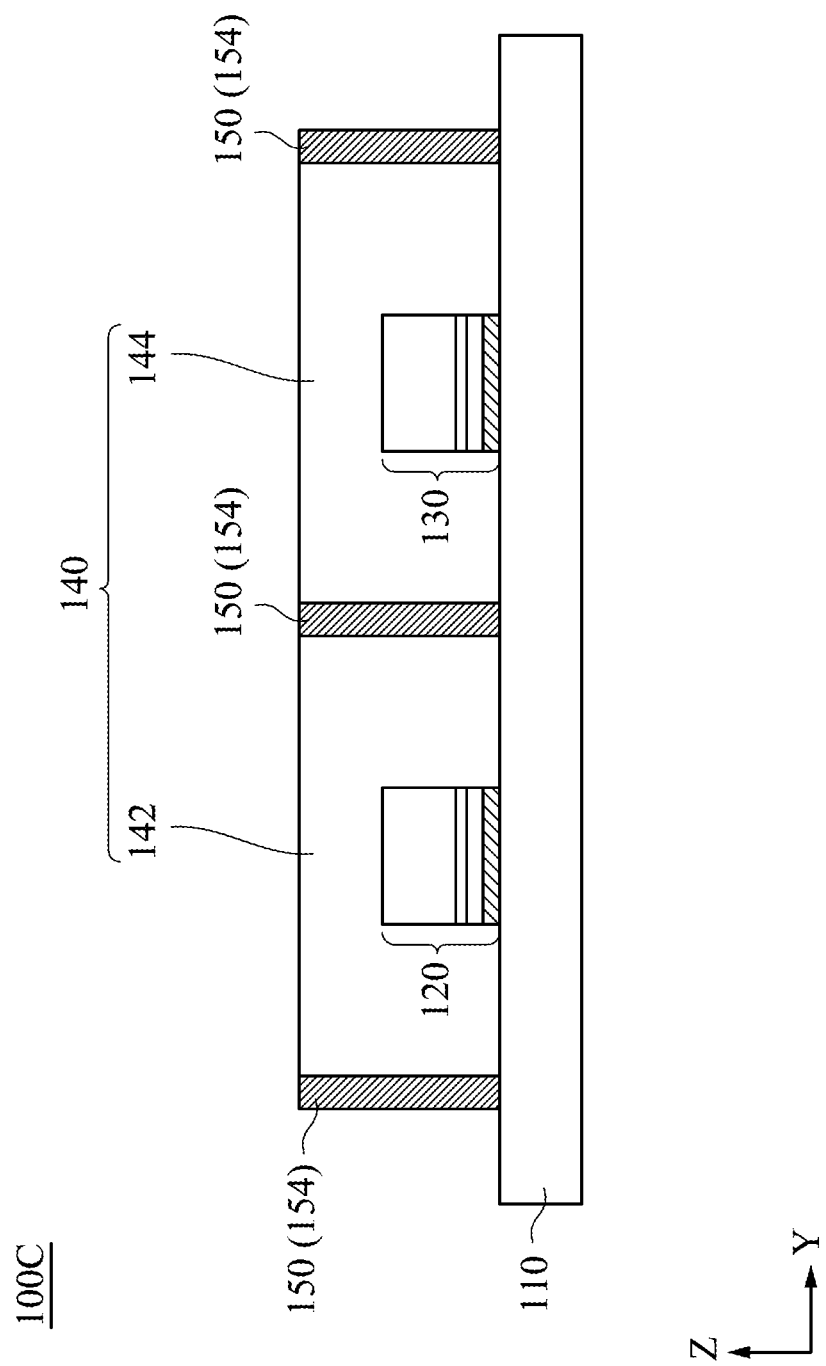
FIG. 3C is a cross-sectional view of a pixel encapsulating structure according to some embodiments of the present disclosure.
Figure 3D:
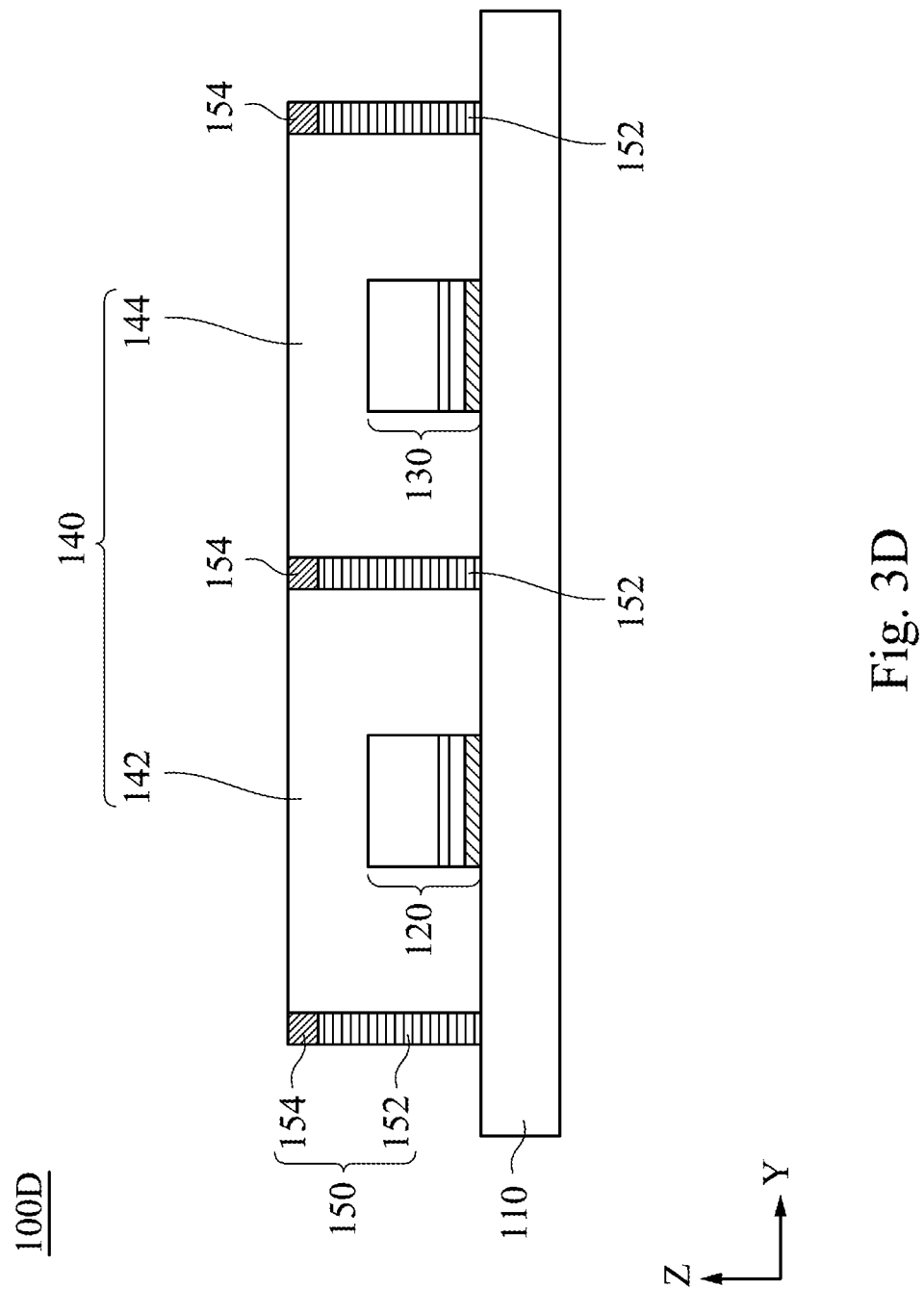
FIG. 3D is a cross-sectional view of a pixel encapsulating structure according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Although most of terms described in the following disclosure use singular nouns, said terms may also be plural in accordance with figures or practical applications.

References are made to FIG. 1. FIG. 1 is a cross-sectional view of a pixel encapsulating structure 100 according to some embodiments of the present disclosure. In some embodiments, a pixel encapsulating structure 100 including a substrate 110, a first light-emitting device 120, a second light-emitting device 130, and a filling material 140 is provided. The first light-emitting device 120 and the second light-emitting device 130 are on the substrate 110. The first light-emitting device 120 and the second light-emitting device 130 have different emission wavelengths. In some embodiments, the first light-emitting device 120 and the second light-emitting device 130 are different light-emitting devices and are structurally separated. The "structurally separated" means not physically and directly connected, whereas remote electrical connections through an electrode or a wire in which a connection point is outside of FIG. 1 (e.g., the connection point in a power supply used to provide voltages for the pixel encapsulating structure 100) is allowed. The filling material 140 is on the substrate 110. In some embodiments, the filling material 140 is also on the first light-emitting device 120 and the second light-emitting device 130. In general, the filling material 140 includes a dielectric material, a photoresist, or a combination thereof. The filling material 140 has two portions respectively covering the first light-emitting device 120 and the second light-emitting device 130. The two portions have different refractive indices. In some embodiments, one of the two portions is a first portion 142, and the other of the two portions is a second portion 144. Specifically, the substrate 110 is extended in a direction Y as shown in all of the figures in the present disclosure, and the filling material 140 covers the first light-emitting device 120 and the second light-emitting device 130 at least from a direction Z as shown in all of the figures in the present disclosure. Generally, the direction Y is perpendicular to the direction Z. In some embodiments, the filling material 140 not only covers but also surrounds the first light-emitting device 120 and the second light-emitting device 130.

In some embodiments, the first portion 142 and the second portion 144 are respectively used to refract light emitted from the first light-emitting device 120 and light emitted from the second light-emitting device 130. Specifically, the first portion 142 and the second portion 144 are used to correct a color shift when viewed from different angles with respect to a normal direction (i.e. off angles with respect to the direction Z) of the pixel encapsulating structure 100. In some embodiments, a vertical projection of the first portion 142 on the substrate 110 is at least partially overlapped with a vertical projection of the first light-emitting device 120 on the substrate 110. In some embodiments, a vertical projection of the second portion 144 on the substrate 110 is at least partially overlapped with a vertical projection of the second light-emitting device 130 on the substrate 110. In some embodiments, the refractive index of the first portion 142 is greater than the refractive index of the second portion 144, and the emission wavelength of the first light-emitting device 120 is greater than the emission wavelength of the second light-emitting device 130. For example, the first light-emitting device 120 can be a light-emitting diode which is configured to emit red light, and the second light-emitting device 130 can be a light-emitting diode which is configured to emit blue light. The colors mentioned above are just exemplifications and shall not be regarded as a limitation to the present disclosure. Due to the snell's law, the dispersion relation, and the above configurations, the correction of the color shift can be realized, so that a wavelength distribution of light received when viewed from the off angle with respect to the direction Z can be more close to a wavelength distribution of light received when viewed from a direction parallel to the direction Z. To put it briefly, the shorter the wavelength of the light, the lower the refractive index for a portion of the filling material 140 is used to refract the light. In some embodiments, the refractive indices of the first portion 142 and the second portion 144 are defined under a wavelength of about 550 nm.

Reference is made to FIG. 2. FIG. 2 is a cross-sectional view of a pixel encapsulating structure 100' according to some embodiments of the present disclosure. A difference between embodiments illustrated by FIG. 2 and the embodiments illustrated by FIG. 1 is that a first portion 142' and a second portion 144' of a filling material 140' are separated from one another in the embodiments illustrated by FIG. 2, whereas the first portion 142 and the second portion 144 of the filling material 140 are in contact with one another in the embodiments illustrated by FIG. 1. A benefit of the above configuration is similar to the benefit of the correction of the color shift which has been described before and will not be repeated again herein.

Reference is made to FIGS. 3A to 3D. FIGS. 3A to 3D are cross-sectional views of pixel encapsulating structures 100A, 100B, 100C, and 100D according to some embodiments of the present disclosure. In some embodiments, each of the pixel encapsulation structures 100A, 100B, 100C, and 100D further include a sidewall 150 as compared to the pixel encapsulation structure 100 as shown in FIG. 1. The sidewall 150 is on the substrate 110 and surrounds the first light-emitting device 120 and the second light-emitting device 130 as shown in FIGS. 3A to 3D. In some embodiments, a part of the sidewall 150 is between the first light-emitting device 120 and the second light-emitting device 130. The sidewall 150 may include a light reflective portion 152 (as referred to FIG. 3B), a light absorbing portion 154 (as referred to FIG. 3C), or a combination thereof (as referred to FIG. 3D). Said combination may be a multi-layer structure including the light reflective portion 152 and the light absorbing portion 154. In some embodiments, the light reflective portion 152 is on the substrate 110. The light absorbing portion 154 is on the light reflective portion 152 and is spaced apart from the substrate 110 by the light reflective portion 152. A reflectance of the light reflective portion 152 is greater than a reflectance of the light absorbing portion 154. In some embodiments, the sidewall 150 includes resin or photoresist, but should not be limited thereto. In some embodiments, the light reflective portion 152 includes tin dioxide ($TiO_2$) particles or/and zirconium dioxide ($ZrO_2$) particles, so as to increase the reflectance of the light reflective portion 152. In some embodiments, a height H1 of the sidewall 150 relative to the substrate 110 is greater than a height H2 of the first light-emitting device 120 relative to the substrate 110. In some embodiments, the height H1 of the sidewall 150 relative to the substrate 110 is greater than a height H3 of the second light-emitting device 130 relative to the substrate 110. As a result, light emitted from the first light-emitting device 120 and the second light-emitting device 130 can be better reflected or absorbed. Individual and combinations of the above conditions for the sidewall 150 reduce interference or cross talk of light from different light-emitting devices (or equivalently, from different pixels) and enhance the light extraction (e.g., using said combination of the light reflective portion and the light absorbing portion) of the first light-emitting device 120 and the second light emitting device 130.

Figure 4:
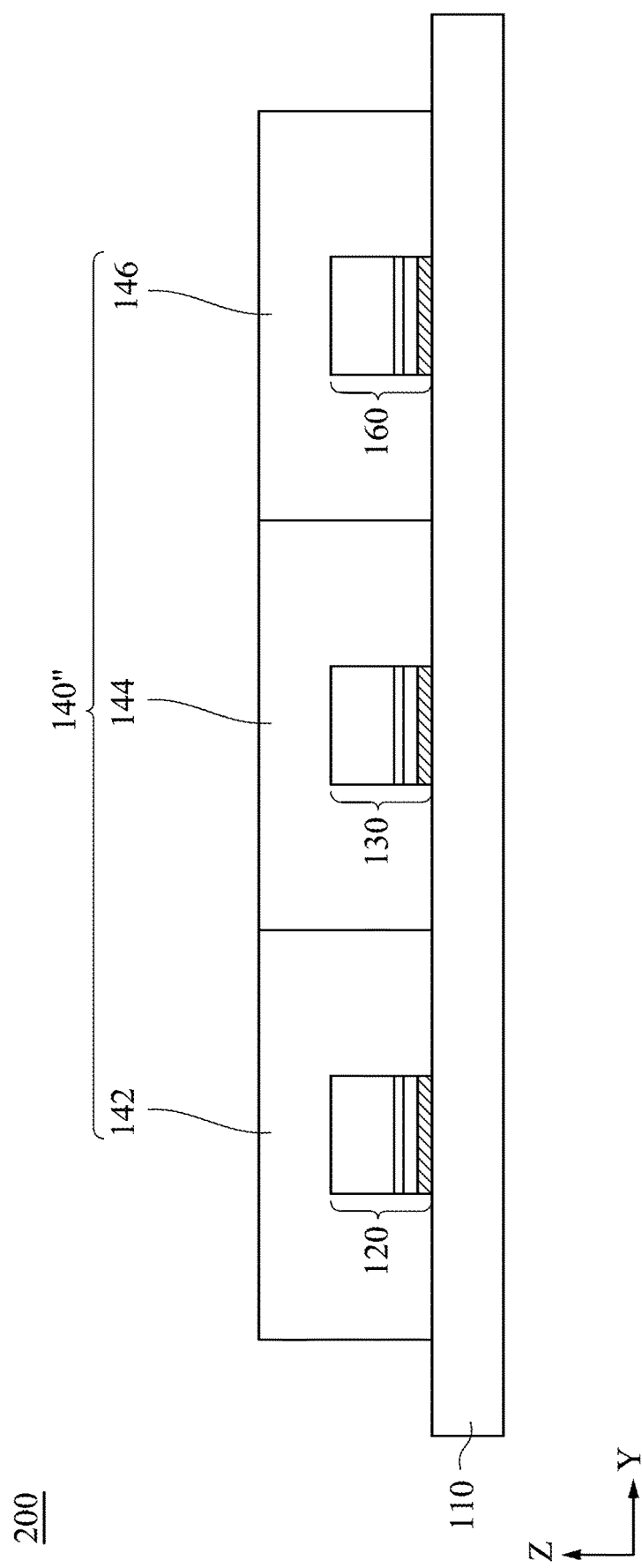
FIG. 4 is a cross-sectional view of a pixel encapsulating structure according to some embodiments of the present disclosure.

Reference is made to FIG. 4. FIG. 4 is a cross-sectional view of a pixel encapsulating structure 200 according to some embodiments of the present disclosure. In some embodiments, a pixel encapsulating structure 200 further includes a third light emitting device 160 on the substrate 110 as compared to the embodiments illustrated by FIG. 1. The third light-emitting device 160 has an emission wavelength different from the emission wavelengths of the first light-emitting device 120 and the emission wavelength of the second light-emitting device 130. In some embodiments, a filling material 140" further includes a third portion 146 as compared to the embodiments illustrated by FIG. 1. The third portion 146 covers the third light-emitting device 160. The third portion 146 has a refractive index different from the refractive indices of the first portion 142 and the second portion 144. In some embodiments, the refractive index of the third portion 146 is greater than the refractive index of the second portion 144 and smaller than the refractive index of the first portion 142, and the emission wavelength of the third light-emitting device 160 is greater than the emission wavelength of the second light-emitting device 130 and smaller than emission wavelength of the first light-emitting device 120. In some embodiments, the refractive index of the third portion 146 is greater than both of the refractive index of the first portion 142 and the refractive index of the second portion 144, and the emission wavelength of the third light-emitting device 160 is greater than both of the emission wavelength of the first light-emitting device 120 and the emission wavelength of the second light-emitting device 130. In some embodiments, the first light-emitting device 120, the second light-emitting device 130, and the third light-emitting device 160 can be a combination of light-emitting diodes configured to emit red light, blue light, and green light, but should not be limited thereto.

In summary, embodiments of the present disclosure provide a pixel encapsulating structure in which a filling material has a plurality of portions having different refractive indices to refract lights emitted from light-emitting devices with different emission wavelengths within one pixel, so as to correct a color shift phenomenon.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A pixel encapsulating structure, comprising:
   a substrate;
   a first light-emitting device on the substrate;
   a second light-emitting device on the substrate, wherein the first light-emitting device and the second light-emitting device have different emission wavelengths; and
   a filling material on the substrate, the first light-emitting device, and the second light-emitting device,
   wherein the filling material has two portions respectively covering the first light-emitting device and the second light-emitting device, said two portions have different refractive indices, and the refractive indices of the two portions are defined under a wavelength of about 550 nm, and
   wherein the two portions are a first portion and a second portion, a vertical projection of the first portion on the substrate is at least partially overlapped with a vertical projection of the first light-emitting device on the substrate, and a vertical projection of the second portion on the substrate is at least partially overlapped with a vertical projection of the second light-emitting device on the substrate.

2. The pixel encapsulating structure of claim 1, wherein the refractive index of the first portion is greater than the refractive index of the second portion, and the emission wavelength of the first light-emitting device is greater than the emission wavelength of the second light-emitting device.

3. The pixel encapsulating structure of claim 1, further comprising:
   a third light-emitting device on the substrate, and the third light-emitting device has an emission wavelength different from the emission wavelength of the first light-emitting device and the emission wavelength of the second light-emitting device.

4. The pixel encapsulating structure of claim 3, wherein the filling material further comprises a third portion covering the third light-emitting device, and the third portion has a refractive index different from the refractive indices of the two portions.

5. The pixel encapsulating structure of claim 1, further comprising a sidewall on the substrate and surrounding the first light-emitting device and the second light-emitting device, wherein a part of the sidewall is between the first light-emitting device and the second light-emitting device.

6. The pixel encapsulating structure of claim 5, wherein a height of the sidewall relative to the substrate is greater than one of a height of the first light-emitting device relative to the substrate and a height of the second light-emitting device relative to the substrate.

7. The pixel encapsulating structure of claim 5, wherein the sidewall comprises a light reflective portion.

8. The pixel encapsulating structure of claim 5, wherein the sidewall comprises a light absorbing portion.

9. The pixel encapsulating structure of claim 5, wherein the sidewall comprises:
   a light reflective portion on the substrate; and
   a light absorbing portion on the light reflective portion and spaced apart from the substrate.

10. The pixel encapsulating structure of claim 9, wherein a reflectance of the light reflective portion is greater than a reflectance of the light absorbing portion.

* * * * *